(12) United States Patent
Brox

(10) Patent No.: US 6,414,531 B2
(45) Date of Patent: Jul. 2, 2002

(54) CIRCUIT CONFIGURATION FOR ADJUSTING SIGNAL DELAY TIMES

(75) Inventor: Martin Brox, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/780,324

(22) Filed: Feb. 9, 2001

(30) Foreign Application Priority Data

Feb. 9, 2000 (DE) .......................................... 100 05 620

(51) Int. Cl.$^7$ ................................................ H03H 11/26
(52) U.S. Cl. .................... 327/290; 327/252; 327/253; 327/283
(58) Field of Search ................................. 327/252, 253, 327/283, 290, 268, 158, 161

(56) References Cited

U.S. PATENT DOCUMENTS 5,828,258 A * 10/1998 Ooishi et al. ............... 327/276
6,124,744 A * 9/2000 Oowaki ...................... 327/262

FOREIGN PATENT DOCUMENTS

| DE | 27 46 655 C2 | 4/1978 |
| DE | 33 29 893 C2 | 3/1985 |
| EP | 0 399 968 B1 | 11/1990 |
| EP | 0 589 763 M1 | 3/1994 |

* cited by examiner

*Primary Examiner*—Kenneth B. Wells
*Assistant Examiner*—An T. Luu
(74) *Attorney, Agent, or Firm*—Herbert Lerner; Laurence A. Greenberg; Werner H. Stemer

(57) ABSTRACT

In order to provide a more flexible adjustment of signal delay times in a circuit configuration containing a line device and a number of electronic components accessing it, it is proposed to add additional capacitances, which can be varied in a controllable manner. In addition, the capacitances are to formed in a region of the existing components.

19 Claims, 4 Drawing Sheets

CIRCUIT CONFIGURATION FOR ADJUSTING SIGNAL DELAY TIMES

BACKGROUND OF THE INVENTION

Field of the Invention

In many circuit configurations, particularly in microelectronics and semiconductor technology, it is necessary for a number of electronic components which are connected to a number of lines via a line device, for example a bus system, to receive specific signals which originate, for example, from a transmitting device. Particularly in pulsed systems, it is in this case furthermore necessary for the arrival or the reception of the signals at the electronic components to differ as little as possible from a predetermined time sequence, in order that a given time structure of further processing steps within the circuit configuration can be complied with in a defined manner.

Particularly in the case of memory systems, a layout is preferred in which the electronic components or memory components are disposed along a transmitting line device, namely a bus system. In order that the signals which are intended to be transmitted via the transmission line device remain in a well-defined time sequence, or remain synchronized, while they are being transmitted along the transmission line device, the signal delay times or the signal delays must be adjusted and must be set to a specific accuracy.

This can be achieved first by the transmission line devices themselves being configured and constructed appropriately, in particular in terms of their capacitive and inductive characteristics.

Second, the electronic components which are connected to the line device, that is to say in particular the memory components, also have electrical characteristics, for example a capacitance and an inductance, which can influence the signal delay times for each individual line component of the line device.

Thus, in order to ensure predefined synchronicity of the signals running on the various line components of the line device, with regard to the various electronic components connected to the line device, it has been proposed in the prior art that an additional optional adjustment device having trimming capacitances or capacitors be configured, which capacitances or capacitors are formed in the region of the electronic components themselves and/or alternatively in the region of the connection devices between the electronic components and the line device, such that the signal delay times of the signal on the lines can be influenced by the additional total capacitances of the adjustment devices.

In known circuit configurations such as semiconductor modules, chips, memory modules and the like, one problem in this case is that the optional additional capacitances which need to be provided in the adjustment devices, and their conductive connections, must be fitted and formed at a very early stage in the production process during the production of, for example, an electronic component which is normally constructed in the form of layers, or a circuit configuration, and can then no longer be varied later.

Even if the optional capacitances to be provided have been selected on the basis of theoretical calculations or on the basis of measurements on prototypes or previous product lines such that they correspond to specific delay time requirements for the signals or signal components on the line devices, the additional total capacitances of the adjustment devices, once they have been configured and constructed, are fixed for a single specific type of electronic component or circuit configuration. This results in that changes to the delay time requirements for the signals, which may occur on the basis of changes to or fluctuations in the production process, on the basis of aging phenomena, on the basis of interactions between the electronic components or the circuit configurations with other electronic components or circuit configurations that are provided, cannot be taken into account in the production process without considerable cost. It is even impossible to react sufficiently flexibly to spontaneously occurring customer requirements relating to the signal delay times since, to do this, the additional capacitances (which are provided on the electronic components or the circuit configuration) of the adjustment devices would have to be fundamentally redesigned. This would necessitate a modification of the production process, and thus a component variation.

However, owing to the time scale aspects, the use of material and, in some circumstances, increased production beyond the desired specification, all these measures would also lead to additional costs associated with the prior art.

SUMMARY OF THE INVENTION

It is accordingly an object of the invention to provide a circuit configuration which overcomes the above-mentioned disadvantages of the prior art devices of this general type, in which signal delay times on the lines can be influenced in a particularly reliable and, at the same time, flexible manner.

With the foregoing and other objects in view there is provided, in accordance with the invention, a semiconductor circuit configuration. The circuit configuration contains at least one line device having a number of lines to transmit a signal, connection devices for relaying the signal, a number of electronic components connected to the line device through the connection devices, and a number of adjustment devices connected to the connection devices in a region of the electronic components such that signal delay times of the signal on the lines can be influenced on a basis of additional total capacitances of the adjustment devices. The additional total capacitances of the adjustment devices are each formed by a capacitance. The adjustment devices each have a switching control device connected to the capacitance for selectively switching the capacitance. In addition, the switching control device functions as a protection device.

In the circuit configuration of the generic type, the line device is provided which has a number of lines or individual lines to transmit the signal. Furthermore, the circuit configuration of the generic type has a number of the electronic components, which can each be connected to the line device via the connection devices that are provided, and are configured to receive the signal. Furthermore, a number of adjustment devices are provided, which are configured to be in contact with the connection devices in the region of the electronic components and/or the connection devices, such that the signal delay times on the lines can be influenced on the basis of additional total capacitances of the adjustment devices.

The achievement of the object according to the invention now contains the adjustment devices being configured such that the values of the additional total capacitances of the adjustment devices can each be varied in a controllable manner.

In contrast to the prior art, in which the capacitances of the adjustment devices on the electronic components or on the circuit configuration with the electronic components are defined and fixed during production of the circuit configuration, the fundamental idea of the solution according to the invention is to provide the capability to vary the additional total capacitances of the adjustment devices in a controllable manner. Therefore, the influence of the total capacitances on the signal delay times of the signal on the individual lines or line devices can be set in a variable, that is to say flexible, manner. Thus, in contrast to the prior art, the circuit configuration according to the invention results in that it is possible to adapt to and to comply with changing signal delay time requirements.

The influence on the signal delay times can be achieved particularly flexibly if, according to one preferred embodiment of the circuit configuration according to the invention, the adjustment devices each have a number of individual capacitances or a single individual capacitance, but which can be varied in a controllable manner, in which case the individual capacitance or the individual capacitances in each case interact to form essentially the additional total capacitance of the respective adjustment device.

When a number of individual capacitances are provided, for example, the possibility of connecting these individual capacitances in various ways allows, for example, a high level of flexibility, for example by connecting them in parallel, with the individual capacitances of the respective adjustment device being added to form the total capacitance of the adjustment device. If a single individual capacitance that can be varied in a controllable manner is provided, the flexibility is obtained from the controllable variation of the individual capacitance as such.

With this procedure, the individual capacitances of a given adjustment device are configured such that they can be connected by switching to a fixed potential, in particular to ground, in parallel with one another and/or in parallel with a respective connection device. This results in relationships that are defined in a particularly stable manner since, on the basis of Kirchhoff's Laws, the parallel connection of individual capacitances allows the individual capacitances to be combined particularly easily and clearly to form a total capacitance, in which case a fixed reference point with respect to the electrical potential, in particular with respect to ground, is in principle preferable.

Specifically, when capacitances are connected in parallel, the individual capacitances of the given adjustment device add up to form the total capacitance of the adjustment device. The capability to switch the individual capacitances can thus be applied to a specific number of combinations of individual capacitances depending on which of the individual capacitances, precisely, are set to a switched or unswitched status with respect to the particular connection device, that is to say which are effective and which are ineffective.

In this case, it is particularly advantageous for the individual capacitances of a given adjustment device each to be configured such that they can be switched on and/or off selectively, independently of one another.

In one preferred embodiment of the circuit configuration according to the invention, a switching control device is in each case formed to produce the capability to switch the respective individual capacitance of a given adjustment device on and/or off selectively. The switching control device results in that the individual capacitances can each be switched on and/or off in a controllable manner, and thus that any desired combination of these individual capacitances, in order to superimpose them to form the total capacitance of the respective adjustment device, is also possible.

In order to set the switching status by the switching control device, the switching control device can advantageously be configured to receive an appropriate control signal. A common switching control device can also be provided for a number of, or all, the individual capacitances of one or more adjustment devices, in which case a more complex, for example appropriately coded, control signal can also be used.

However, it is particularly advantageous if the switching control devices each directly access that individual capacitance of a given adjustment device which is to be actuated or switched. For this purpose, a further refinement of the circuit configuration according to the invention provides that the switching control devices are each configured such that they can be connected in series with the respective individual capacitance of a given adjustment device in a line to a respective connection device.

In principle, any device by which the respective individual capacitance for a respective connection device can be switched to a contact-made/switched state or to a contact-broken/unswitched state can be used as the switching control device for switching the respective individual capacitances on and/or off.

The invention also provides for each of the switching control devices to be in the form of a protection device, in particular in the form of a so-called laser fuse or electrical fuse. In this case, an external light signal or an external electrical signal is used to change the contact status of the respective individual capacitance of a given adjustment device with respect to a connection device from a contact-made status to an interrupted status, or vice versa.

These cited protection devices may also be addressed in an intermediate step during the production of the electronic components or of the circuit configuration in order to adapt the corresponding individual capacitances of the adjustment devices in order to appropriately influence the signal delay times even at an intermediate stage of the circuit configuration.

The adaptation process for the signal delay times is particularly flexible if, according to a further preferred embodiment of the circuit configuration according to the invention, a memory element, in particular a 1-bit memory element, is provided for each individual capacitance, and if a switching signal for setting a switching state and/or the value of the respective individual capacitance can be generated by the switching control device on the basis of the contents of the respective memory element. Therefore, the switching state or the value of the respective individual capacitance can be changed even without any additional measures, for example a laser for activation or deactivation of a laser fuse, to be precise reproducibly on the basis of the memory contents.

The memory elements may be configured as part of the switching control devices or separately from them, in which case, in the latter situation, the memory contents may also be used as control signals for the switching control devices. A common memory device may also be provided for a number of, or all, the individual capacitances of one of, of a number of, or all the adjustment devices, whose memory contents allow the configuration of the switched and unswitched individual capacitances and/or their values to be represented.

In this case, it is particularly advantageous for an access device to be provided by which the switching state and/or the value of the respective individual capacitance can be set essentially freely, in particular externally, directly and/or indirectly, under the influence of memory contents.

It is thus possible, by use of the respective memory elements, with or without the access device and possibly via external programming, to define which of the respective individual capacitances are or are not switched, in order to achieve a required combination of the respective individual capacitances to form the total capacitances.

Then, if required, the memory contents of the respective memory elements can be changed via the external access such that appropriate control signals for setting another switching state, for example an adapted or improved switching state, can be generated in order to produce better-matched total capacitances, and thus improved or desired signal delay times, on the line device of the circuit configuration.

Therefore, the total capacitances of the individual adjustment devices can be programmed freely, in particular externally. In consequence, it is not only possible to improve the delay time relationships on the line device of the circuit configuration, but it is also possible to deliberately carry out tests with particularly sharply differing delay times, in order to study the stability of the circuit configuration and its behavior, and/or the interaction of such a circuit configuration within a higher-level apparatus.

In order to allow the total capacitances of the adjustment devices to be varied as flexibly as possible, a further advantageous development of the circuit configuration according to the invention provides for the values of the individual capacitances of the adjustment devices each to satisfy the relationships $$C_j = C_0 \cdot 2^{j-i}$$

where j runs from 1 to the respective total number N of individual capacitances, in particular after 4, and where $C_0$ indicates a minimum basic capacitance, in particular about 10 fF. This corresponds to binary coding of the values of the individual capacitances, although any other form of coding or assignment of the values to the individual capacitances may be selected.

If these binary-coded individual capacitances $C_j$ are at the same time connected in parallel, this thus results in that the total capacitance varies with the sum of the individual capacitances from 0 to $C_0 \cdot (2^N - 1)$ If there are four individual capacitances, that is to say N=4, and one basic capacitance of $C_0$=10 fF, this would thus have a range from 0 to 150 fF with a resolution of 10 fF. $C_0$ thus indicates the accuracy with which a total capacitance can be adjusted.

Normally, in memory modules and other circuit configurations in microelectronics and semiconductor technology, it is necessary to correct capacitances of electronic components or circuit configurations in an order of magnitude of 200 fF with an accuracy of better than 50 fF. The binary coding discussed above satisfies these requirements.

The actual embodiments of the individual capacitances of the adjustment devices can be borrowed from all those electronic components and structures, in particular from microelectronics and semiconductor technology, which preferably provide a capacitance in a simple manner. It is feasible for the individual capacitances of the adjustment devices each to be derived as the depletion-layer or diffusion layer capacitance of a diode, of an n-channel field-effect transistor, of a general np-junction, or the like. Furthermore, the individual capacitance can in each case be derived as the capacitance of a metal-foil capacitor or the like.

In summary, a core idea of the invention described above is thus to provide adjustment devices with individual capacitances which can be varied in a controllable manner on circuit configurations, and by which the individual capacitances of electronic components or parts of the circuit configuration, in particular after wafer production if appropriate, can be changed in such a manner that signal delay times in the circuit configuration can be influenced in a particularly simple and flexible manner.

The concept according to the invention of a circuit configuration having individual capacitances which can be varied in a controllable manner can be applied in particular to RDRAM or SDRAM modules, or the like.

Other features which are considered as characteristic for the invention are set forth in the appended claims.

Although the invention is illustrated and described herein as embodied in a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
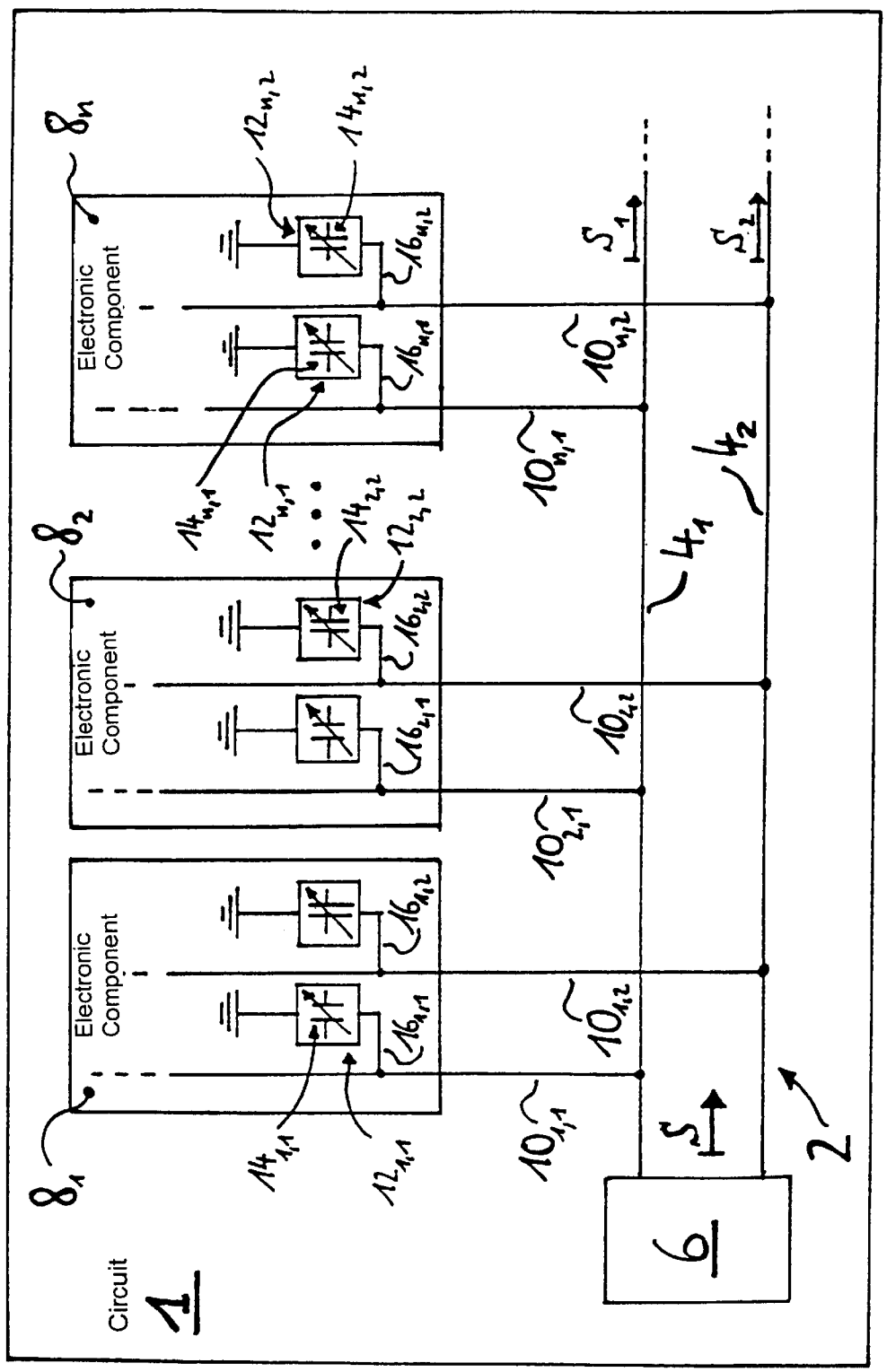
FIG. 1 is a block circuit diagram of a first embodiment of a circuit configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a first embodiment of a circuit configuration 1 according to the invention.

In the circuit configuration 1, a number of electronic components $8_1, \ldots, 8_n$ are connected via connection devices $10_{1,1}, \ldots, 10_{n,1}$ to a bus device or line device 2, which has a number of lines $4_1$ and $4_2$. The multiplicity of lines may be higher, depending on the width of the bus, and is not limited to the two lines $4_1$ and $4_2$. In the exemplary embodiment shown in FIG. 1, a signal S with signal components $S_1$ and $S_2$ is applied externally to the individual lines $4_1$ and $4_2$.

Due to the interaction of the individual lines or lines $4_1$ and $4_2$ with the line devices $10_{1,1}, \ldots, 10_{n,1}$ and, in particular, with the respective total capacitances of the electronic components $8_1, \ldots, 8_n$, delay times $t_1$ and $t_2$ of the signal components $S_1$ and $S_2$ may, in certain circumstances, have discrepancies which are outside the specification for the circuit configuration and, in particular, for the bus or the line device 2.

These discrepancies may be related to aging, or else may be caused by variations within the production process.

In order to influence and adapt the signal delay times $t_1$ and $t_2$, adjustment devices $12_{1,1}, \ldots, 12_{n,2}$ are connected via appropriate line devices $16_{1,1}, \ldots, 16_{n,1}$ to the connection devices $10_{1,1}, \ldots, 10_{n,2}$ within the electronic components $8_1, \ldots, 8_n$, in the exemplary embodiment of the circuit configuration 1 according to the invention and shown in FIG. 1. According to the invention, these adjustment devices $12_{1,1}, \ldots, 12_{n,2}$ have total capacitances $14_{1,1}, \ldots, 14_{n,2}$ which can be varied in a controllable manner and are connected to ground.

Figure 2:
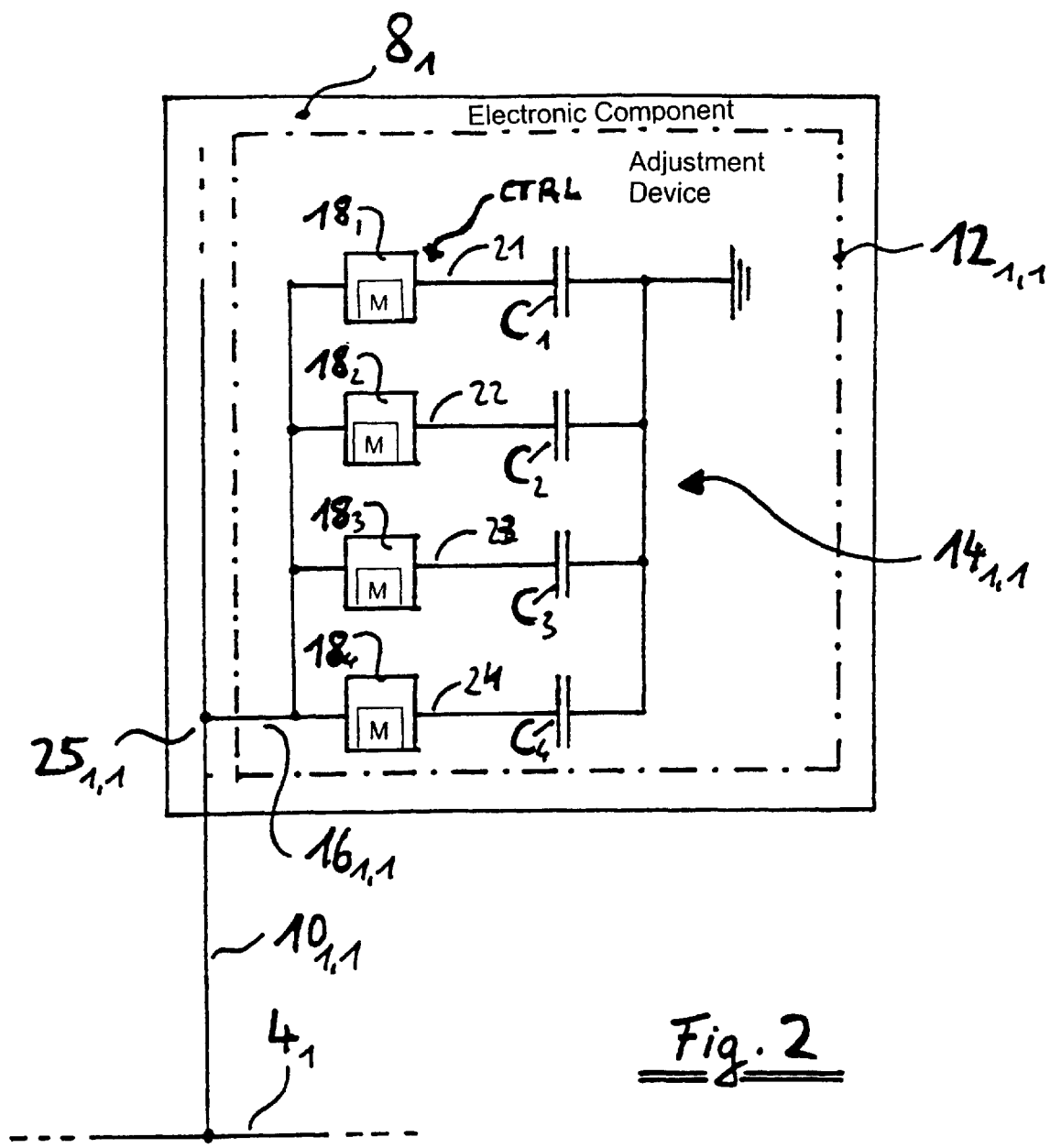
FIG. 2 is a block circuit diagram of details of a second embodiment of the circuit configuration.

FIG. 2 uses a schematic block diagram to show in detail how the electronic component $8_1$ is constructed for the adjustment device $12_{1,1}$, and is connected by the connection device $10_{1,1}$ to the line $4_1$ of the line device 2 within an exemplary embodiment of the circuit configuration according to the invention. Appropriate further connection devices can be provided, depending on the total number of external connections required for the electronic component $8_1$.

Contact is made with the adjustment device $12_{1,1}$ via the line device $16_{1,1}$ at a node $25_{1,1}$ which may, for example, be in the form of a pad of an integrated circuit, of a semiconductor module or the like. The adjustment device $12_{1,1}$ has a parallel circuit formed by four individual capacitances $C_1$, ..., $C_4$ to ground. Switching control devices $18_1, \ldots, 18_4$ corresponding to the individual capacitances $C_1, \ldots, C_4$ are connected in series in a respective line 21 to 24, in order to set the respective individual capacitance $C_1, \ldots, C_4$ as being switched or as being unswitched with respect to a corresponding control signals CTRL. The parallel circuit of the switched individual capacitances forms, by addition, the total capacitance $14_{1,1}$ of the adjustment device $12_{1,1}$. Optionally, the switching control devices $18_1, \ldots, 18_4$ each have a memory element M, in particular a 1-bit memory element M, for each individual capacitance, and if a switching signal for setting a switching state and/or the value of the respective individual capacitance can be generated by the switching control device $18_1, \ldots, 18_4$ on the basis of the contents of the respective memory element.

Figure 3:
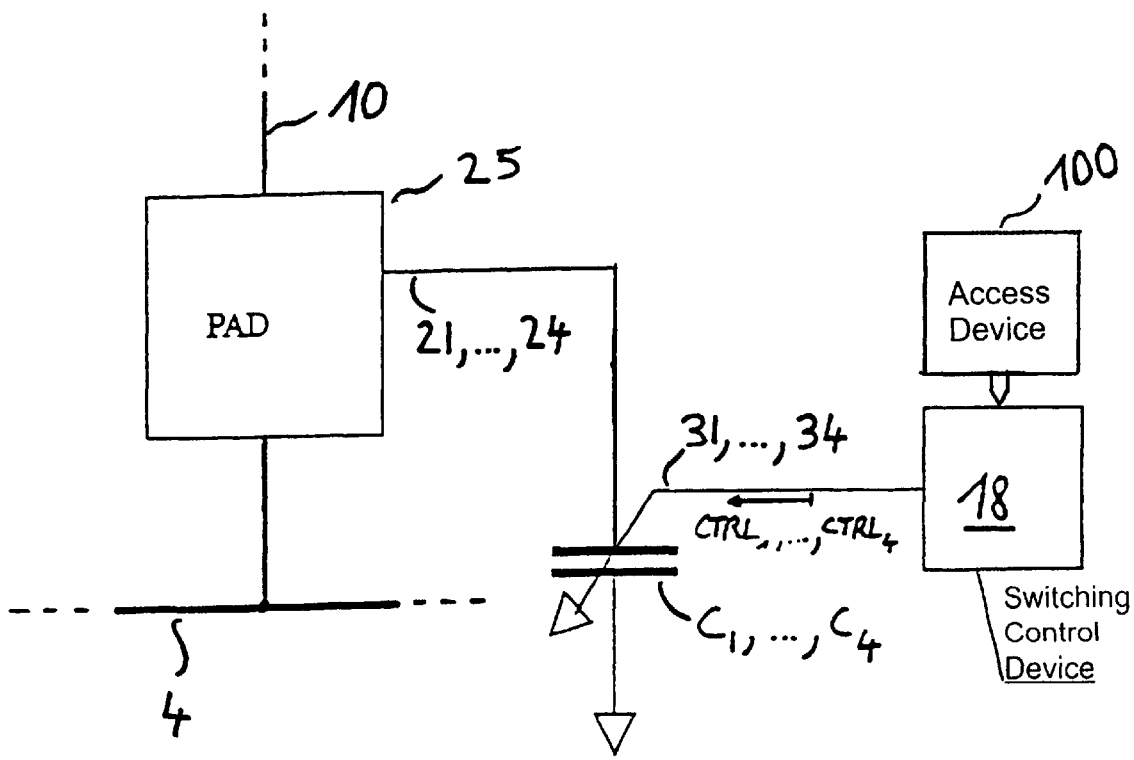
FIG. 3 is a block circuit diagram of a third exemplary embodiment of the circuit configuration.

The schematic block diagram in FIG. 3 shows a further embodiment of the circuit configuration 1 according to the invention, in which case the lines 21 to 24 make contact with at a node 25 or pad, in order to connect to ground the respective individual capacitances $C_1, \ldots, C_4$, connected in parallel with a connection device 10 to a bus line 4 via a common switching control device 18 and control signals $CTRL_1, \ldots, CTRL_4$. The capacitances $C_1, \ldots, C_4$ may be controllable both with regard to their absolute switching state—made contact with or not made contact with—and with regard to the value of their capacitance, via the control signals $CTRL_1, \ldots, CTRL_4$. The control signals $CTRL_1, \ldots, CTRL_4$ are supplied via control lines 31, ..., 34.

Figure 4A:
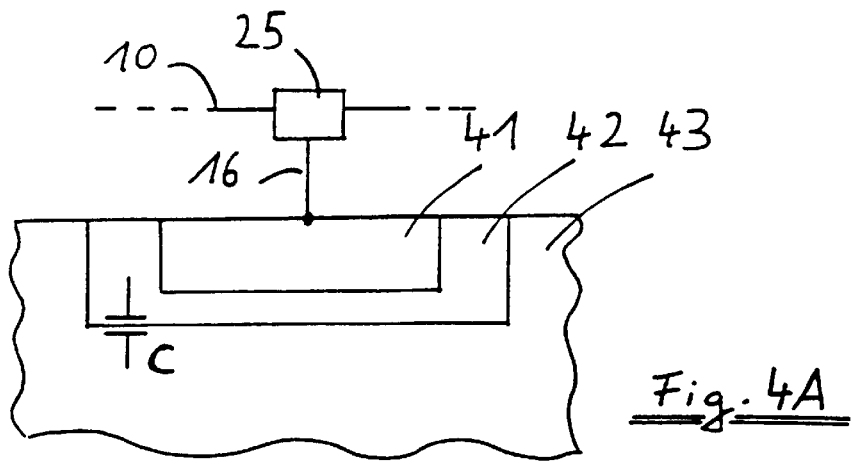
FIGS. 4A–4C are block circuit diagrams of embodiments of individual capacitances for use in an exemplary embodiment of the circuit configuration.
Figure 4B:
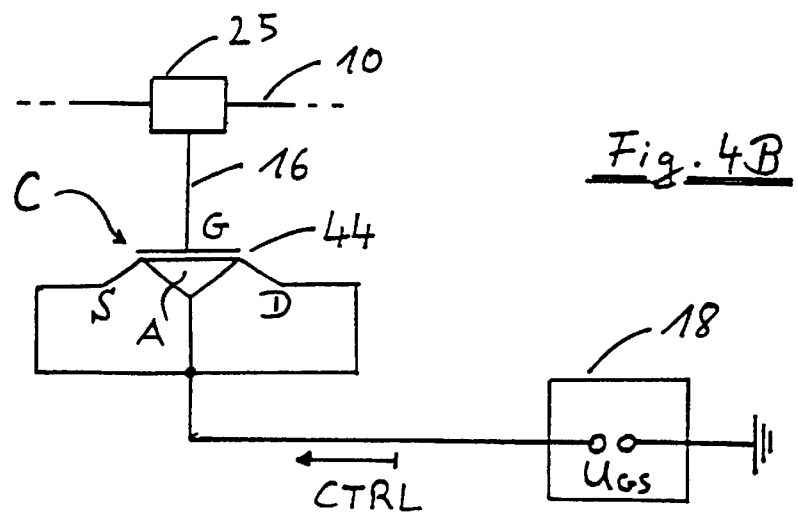
Figure 4C:
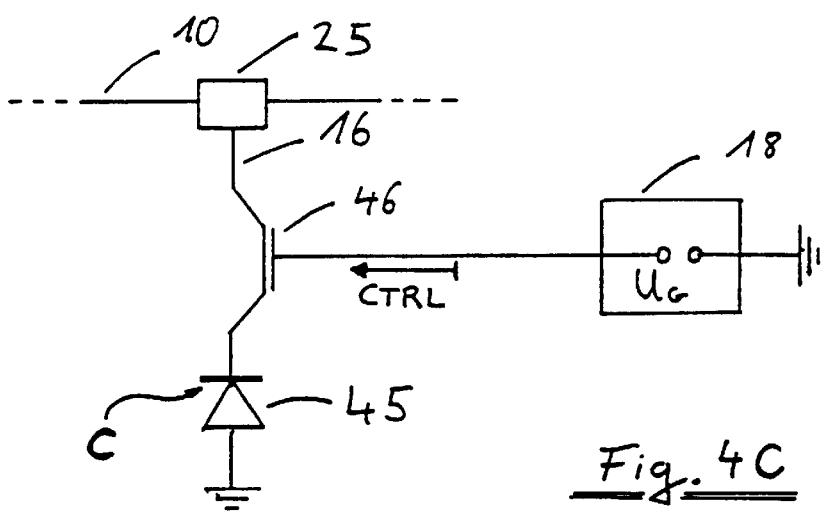

The schematic illustrations in FIGS. 4A to 4C show the construction of the controllable capacitances in various embodiments.

In the embodiment in FIG. 4A, a diffusion-layer or depletion-layer capacitance C of an n-diffusion layer 41 is produced with respect to a p-substrate 43 in an n-well 42, with the n-diffusion layer 41 in the semiconductor substrate 43 being connected by a line device 16 via the node 25 or the pad 25 of a semiconductor module.

The illustration in FIG. 4B shows how a gate capacitance of an n-channel field-effect transistor 44 (nFET) can be used as an individual capacitance C, with the value of the capacitance being controllable via a voltage $U_{GS}$ between a source S and a gate G—which may also be related to ground—as the control signal CTRL, and with the source S, the drain D and a substrate A of the nFET 44 being at the same potential. The control voltage $U_{GS}$ is generated by the control switching device 18.

FIG. 4C shows how a diode 45 can be used in order to exploit its diffusion-layer or depletion-layer capacitance as the individual capacitance C. A field-effect transistor 46 connected in between can be used to switch the individual capacitance C of the diode 45, by a gate voltage UG applied as the control signal CTRL via the switching control device 18, to the PAD 25 and to the connection device 10.

As a further embodiment of the invention, an access device 100 can be provided (see FIG. 3) by which a switching state and/or a value of a respective individual capacitance can be set.

I claim:

1. A semiconductor circuit configuration, comprising:
   at least one line device having a number of lines to transmit a signal;
   connection devices for relaying the signal;
   a number of electronic components connected to said line device through said connection devices; and
   a number of adjustment devices connected to said connection devices in a region of said electronic components such that signal delay times of the signal on said lines can be influenced on a basis of additional total capacitances of said adjustment devices, the additional total capacitances of said adjustment devices are each formed by a capacitance, said adjustment devices each having a switching control device connected to said capacitance for selectively switching said capacitance, said switching control device functioning as a protection device.

2. The circuit configuration according to claim 1, wherein said capacitance of a given one of said adjustment devices is one of a plurality of capacitances and each of said capacitances are configured such that it can be connected by switching to a fixed potential, in parallel with one another.

3. The circuit configuration according to claim 2, wherein said capacitances of said given one of said adjustment devices are each configured such that they can be switched selectively, and independently of one another.

4. The circuit configuration according to claim 2, wherein said switching control device is one of a plurality of switching control devices and are each configured such that they can be connected in series with a respective one of said capacitances of said given one of said adjustment devices in a line to a respective one of said connection devices.

5. The circuit configuration according to claim 4, wherein:
   said switching control device has a memory element for each of said capacitances; and
   a control signal for setting at least one of a switching state and a value of a respective capacitance can be generated by said switching control device on a basis of a contents of said memory element.

6. The circuit configuration according to claim 1, including an access device by which one of a switching state and a value of a respective individual capacitance can be set.

7. The circuit configuration according to claim 2, wherein a value of each of said capacitances of said adjustment devices each satisfy the relationship $$C_j = C_0 \cdot 2^{j-1}$$

where j runs from 1 to the respective total number of said capacitances, and $C_0$ indicates a minimum basic capacitance.

8. The circuit configuration according to claim 2, wherein each of said capacitances of said adjustment devices includes a layer selected from the group consisting of a depletion-layer and a diffusion-layer capacitance of a diode.

9. The circuit configuration according to claim 1, wherein said capacitance is one of a plurality of capacitances.

10. The circuit configuration according to claim 1, wherein said capacitance is a variable capacitance which can be varied in a controllable manner.

11. The circuit configuration according to claim 1, wherein said protection device is a fuse selected from the group consisting of laser fuses and electrical fuses.

12. The circuit configuration according to claim 1, wherein said capacitance of a given one of said adjustment devices is one of a plurality of capacitances and each are configured such that it can be connected by switching to a fixed potential, in parallel with a respective one of said connection devices.

13. The circuit configuration according to claim 2, wherein said fixed potential is a ground potential.

14. The circuit configuration according to claim 5, wherein said memory element is a 1-bit memory element.

15. The circuit configuration according to claim 4, wherein:

said switching control device has a memory element provided for all of said capacitances of one of said adjustment devices; and a control signal for setting at least one of a switching state and a value of a respective capacitance can be generated by said switching control device on a basis of a contents of said memory element.

16. The circuit configuration according to claim 7, wherein $C_0$ is 10 fF and $j=4$.

17. The circuit configuration according to claim 2, wherein each of said capacitances of said adjustment devices has an-channel field-effect transistor.

18. The circuit configuration according to claim 2, wherein each of said capacitances of said adjustment devices has a general np-junction.

19. The circuit configuration according to claim 2, wherein each of said capacitances of said adjustment devices is a metal-foil capacitor.

* * * * *